US009767987B2

(12) United States Patent
Godet et al.

(10) Patent No.: US 9,767,987 B2
(45) Date of Patent: *Sep. 19, 2017

(54) METHOD AND SYSTEM FOR MODIFYING SUBSTRATE RELIEF FEATURES USING ION IMPLANTATION

(71) Applicant: Varian Semiconductor Equipment Associates, Inc., Gloucester, MA (US)

(72) Inventors: Ludovic Godet, Sunnyvale, CA (US); Patrick M. Martin, Ipswich, MA (US); Timothy J. Miller, Ipswich, MA (US); Vikram Singh, North Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 254 days.

This patent is subject to a terminal disclaimer.

(21) Appl. No.: 14/288,853

(22) Filed: May 28, 2014

(65) Prior Publication Data
US 2014/0306127 A1    Oct. 16, 2014

Related U.S. Application Data

(62) Division of application No. 13/046,136, filed on Mar. 11, 2011, now Pat. No. 8,778,603.
(Continued)

(51) Int. Cl.
*H01J 37/317* (2006.01)
*H01L 21/265* (2006.01)
(Continued)

(52) U.S. Cl.
CPC .............. *H01J 37/317* (2013.01); *G03F 7/40* (2013.01); *H01J 37/3171* (2013.01);
(Continued)

(58) Field of Classification Search
CPC .. H01J 37/317; H01J 37/3171; H01J 37/3174; H01J 37/32623; H01J 37/32357;
(Continued)

(56) References Cited

U.S. PATENT DOCUMENTS 7,767,977 B1 *  8/2010  Godet ................... H01J 27/024
                                                            250/423 R
8,101,510 B2 *  1/2012  Godet ............... H01J 37/32623
                                                            118/723 R
(Continued)

FOREIGN PATENT DOCUMENTS

JP    2001-358061 A    12/2001
JP    2003-347734 A    12/2003
(Continued)

*Primary Examiner* — Anita Alanko (57) ABSTRACT

A method of treating resist features comprises positioning, in a process chamber, a substrate having a set of patterned resist features on a first side of the substrate and generating a plasma in the process chamber having a plasma sheath adjacent to the first side of the substrate. The method may further comprise modifying a shape of a boundary between the plasma and the plasma sheath with a plasma sheath modifier so that a portion of the shape of the boundary is not parallel to a plane defined by a front surface of the substrate facing the plasma, wherein ions from the plasma impinge on the patterned resist features over a wide angular range during a first exposure.

20 Claims, 6 Drawing Sheets

Related U.S. Application Data (60) Provisional application No. 61/340,268, filed on Mar. 15, 2010.

(51) Int. Cl.

| | | |
|---|---|---|
| *H01L 21/263* | (2006.01) | |
| *H01J 37/32* | (2006.01) | |
| *H01L 21/027* | (2006.01) | |
| *H01L 21/223* | (2006.01) | |
| *G03F 7/40* | (2006.01) | |
| *H01L 29/66* | (2006.01) | |

(52) U.S. Cl.
CPC .... *H01J 37/3174* (2013.01); *H01J 37/32357* (2013.01); *H01J 37/32422* (2013.01); *H01J 37/32623* (2013.01); *H01L 21/0273* (2013.01); *H01L 21/2236* (2013.01); *H01L 21/263* (2013.01); *H01L 21/265* (2013.01); *H01L 29/66787* (2013.01)

(58) Field of Classification Search
CPC ............. H01J 37/32422; H01L 21/265; H01L 21/263; H01L 21/0273; H01L 21/2236; H01L 29/66787; G03F 7/40
See application file for complete search history.

(56) References Cited

U.S. PATENT DOCUMENTS

| | | | | |
|---|---|---|---|---|
| 8,188,445 B2* | 5/2012 | Godet | .................... | H01J 27/08 250/423 R |
| 8,435,727 B2* | 5/2013 | Godet | .................. | G03F 7/7045 430/322 |
| 8,460,569 B2* | 6/2013 | Godet | .................... | H01L 21/306 216/62 |
| 8,603,591 B2* | 12/2013 | Godet | .................... | C23C 16/045 118/723 R |
| 8,716,682 B2* | 5/2014 | Renau | .................... | H01J 27/024 250/492.21 |
| 8,778,465 B2* | 7/2014 | Godet | .................... | C23C 16/045 427/331 |
| 8,778,603 B2* | 7/2014 | Godet | ....................... | G03F 7/40 250/492.3 |
| 8,974,683 B2* | 3/2015 | Godet | ................. | H01L 21/0273 216/41 |
| 9,118,001 B2* | 8/2015 | Godet | ...................... | H01L 43/12 |
| 2006/0236931 A1* | 10/2006 | Singh | ..................... | C23C 14/48 118/723 E |
| 2009/0026540 A1* | 1/2009 | Sasaki | ................. | H01L 29/7854 257/344 |
| 2012/0228515 A1* | 9/2012 | Leavitt | ................ | H01J 37/3023 250/396 R |
| 2012/0263887 A1* | 10/2012 | Papasouliotis | .... | C23C 16/45551 427/569 |
| 2014/0273502 A1* | 9/2014 | Hatem | ................... | C23C 14/042 438/758 |
| 2015/0371827 A1* | 12/2015 | Godet | ................. | H01J 37/3172 216/67 |
| 2016/0042922 A1* | 2/2016 | Omstead | ........... | H01L 21/76892 438/712 |
| 2016/0042975 A1* | 2/2016 | Ma | ..................... | H01L 21/32136 438/720 |

FOREIGN PATENT DOCUMENTS

| | | |
|---|---|---|
| JP | 2008-198988 A | 8/2008 |
| WO | 2011/022635 A2 | 2/2011 |

\* cited by examiner (Prior art)

METHOD AND SYSTEM FOR MODIFYING SUBSTRATE RELIEF FEATURES USING ION IMPLANTATION

This application claims priority to U.S. provisional patent application Ser. No. 61/340,268, filed Mar. 15, 2010, and is a divisional of U.S. patent application Ser. No. 13/046,136 filed Mar. 11, 2011, incorporated by reference herein in its entirety.

BACKGROUND OF THE INVENTION

Field of the Invention

Embodiments of the invention relate to the field of device manufacturing. More particularly, the present invention relates to a method, system and structure for patterning a substrate and for implanting into a substrate for manufacturing a device.

Discussion of Related Art

Figure 1A:
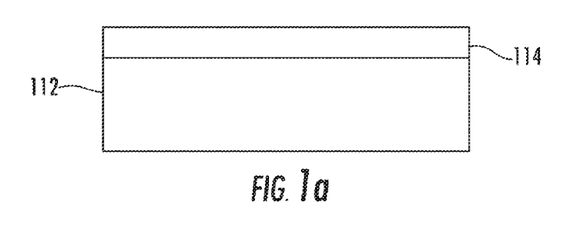
FIGS. 1a-1e are schematic cross-sections of a substrate that illustrate steps of a conventional optical lithographic process.
Figure 1B:
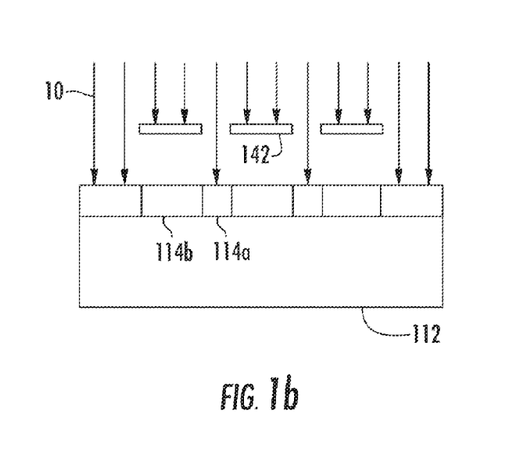

Optical lithography is often used in manufacturing electronic devices. It is a process by which a substrate is patterned so that circuit may be formed on the substrate according to the pattern. Referring to FIG. 1a-1e, there are shown simplified illustrations of the optical lithographic process. Generally, the substrate 112 is coated with photo-curable, polymeric photoresist 114 (FIG. 1a). Thereafter, a mask 142 having a desired aperture pattern is disposed between the substrate 114 and a light source (not shown). The light 10 from the light source is illuminated onto the substrate 112 via the aperture of the mask 142, and the light transmitted through the mask's aperture (or the image of the pattern) is projected onto the photoresist 114. A portion of the photoresist 114a is exposed to the light 10 and cured, whereas the rest of the photoresist 114b remains uncured (FIG. 1b). As a result, an image of the mask's apertures may form by the cured portion of the photoresist 114a.

Figure 1C:
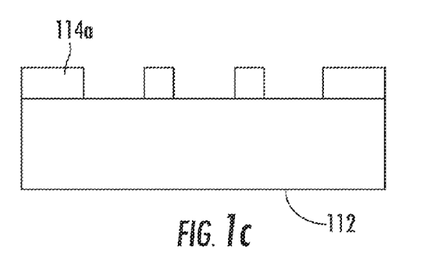
Figure 1D:
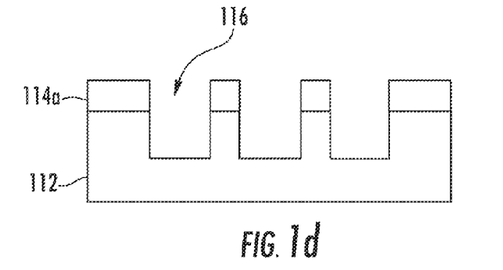
Figure 1E:
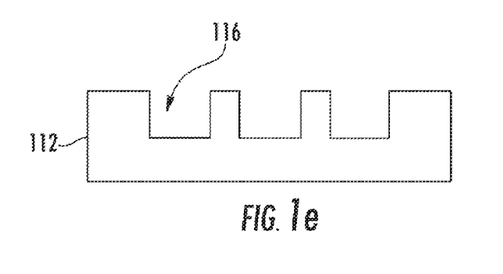

As illustrated in FIG. 1c, the uncured portion of the photoresist 114b is stripped, and 3D photoresist feature or relief 114a corresponding to the mask's aperture pattern may remain on the substrate 112. Thereafter, the substrate is etched, and trenches 116 corresponding to the negative image of the mask's aperture pattern may form (FIG. 1d). After the remaining photoresist 114b is removed, a patterned substrate 112 may form (FIG. 1e). If a metallic layer is deposited on the trenches, a circuit having a desired pattern may be formed on the substrate 112.

Figure 2:
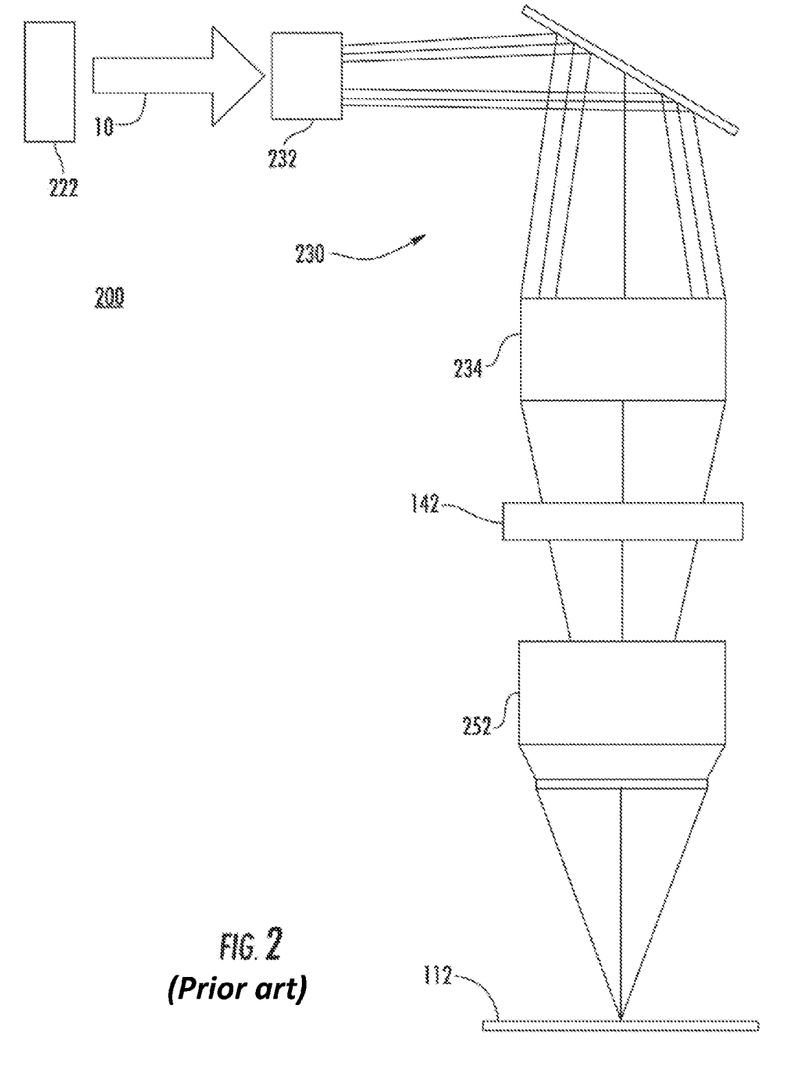
FIG. 2 is a schematic depiction of a conventional optical lithographic system for projecting the image of a mask's aperture pattern onto a substrate.

Referring to FIG. 2, there is shown a conventional optical lithographic system 200 for projecting the image of the mask's aperture pattern to the substrate. The optical lithography system 200 comprises a light source 222, an optical integrator 232, and a condenser lens 234. In addition, the optical lithography system 200 may comprise mask 142 having a desired aperture pattern and a projection lens 252. As illustrated in the figure, light having desired wavelength is emitted from the light source 222 to the optical integrator 232 and the condenser lens 234, which are collectively known as an illuminator 230. In the illuminator 230, the light 10 is expanded, homogenized, condensed, or otherwise conditioned. The light 10 is then illuminated onto the mask 142 having the desired aperture pattern to be projected onto the substrate 112. The light 10 transmitted through the apertures of the mask 142 may contain the information on the mask's aperture pattern. The light 10 is then captured by the projection lens 252 which projects the light 10 or the image of the mask's aperture pattern onto the photoresist deposited on the substrate 112. In projecting the image, the projection lens 10 may reduce the image by a factor of four or five.

To generate circuit patterns with smaller feature size (e.g. width of the trench), several modifications have been implemented into the process. As known in the art, the ability to project a clear image of a small feature may depend on, among others, the wavelength of the light used in the process. Currently, UV light with wavelengths of 365 nm and 248 nm, and 193 nm are used. In particular, to generate circuits with 13.5 nm width, argon fluoride (ArF) excimer laser with 193 nm have been proposed.

Although optical lithography is an efficient process with high throughput, the process is not without disadvantages. One disadvantage may include line width roughness (LWR) or line edge roughness (LER). As known in the art, LWR is excessive variations in the width of the photoresist feature formed after uncured portion of the photoresist 114b is stripped from the substrate. If the variations occur on the side surface of the photoresist relief or feature, the variations is known as LER. The roughness or variations due to LWR or LER may be disadvantageous as the variation may be transferred onto the trenches during etch and ultimately to the circuit. The variations become more significant with decrease in feature size of the photoresist relief or trenches. For example, variations of 4 nm or larger have been observed a 193 nm based lithographic process producing 13.5 nm feature size. Because the geometrical shape of a patterned resist feature, including line roughness effects, such as LWR and LER, is transferred from a resist layer to an underlying permanent layer of a device during patterning of the underlying layer, LWR and LER can limit the ability to form devices of acceptable quality for dimensions below about 100 nm. Such variations may lead to non-uniform circuits and ultimately device degradation or failure. In addition, depending on design criteria, device performance may be impacted more by either one of short, medium, or long range roughness.

Several approaches have been attempted to address LWR and LER effects. In one example, dry chemical etch process has been employed which has the ability to remove resist, but generally suffer from pattern dependent loading effects in which the removal is different in densely patterned regions as opposed to isolated features. Such dry chemical etching processes may also impart unwanted defects into a resist pattern, which could result in yield loss. In addition, it is important that any process used to address LWR/LER effects in resist, leave the original resist attributes, such as resist height, width, and profile, intact, in order to maintain tight control of the critical dimension (CD) of underlying features to be patterned.

Another approach used to address LWR and LER effects has been to use deep ultraviolet (DUV) curing by exposing a rough pattern to a UV lamp in which heating through radiation exposure is used to smooth out rough lines. This approach has the unwanted side effect of causing pattern pullback at line segment corners, causing lines to deform in such a way as to render devices useless.

In order to address the diffraction limit of UV lithography processing of resist, where lines or other patterns may have CD feature sizes below the diffraction limit of the illuminating radiation, double patterning lithography (DPL) has been developed. Multiple approaches have been employed in an attempt to ensure success of DPL, including self aligned double patterning lithography and chemical freeze lithography. However, each of these processes may have both advantages and disadvantages with respect to cost and/or yield.

In addition to the aforementioned challenges regarding control of resist patterning, control of the size and shape of patterned substrate features after their formation remains a challenge. It is well known that controlling the etching conditions for patterning substrate features used to form devices, such as polysilicon or metal gates, or silicon fins, may be critical in defining the eventual shape and size of such features after etching. In addition, processing steps such as ion implantation may affect the shape and size of such substrate features, especially those having dimensions on the order of 100 nm or less. For example, ion implantation of substrates to provide doping of devices having silicon fins may inadvertently cause etching/sputtering of the fins. In some cases, the silicon fins may develop pronounced faceting, which may substantially alter device properties of fin-based devices to be formed.

In view of the above, it will be appreciated that there is a need to improve processes that affect device feature patterning, such as resist lithography processes and device doping processes, especially for technologies requiring very small feature sizes, such as sub-100 nm CD devices.

SUMMARY OF THE INVENTION

Embodiments of the present invention are related to methods and systems for improving patterning a substrate, in particular, by treating relief features such as patterned resist features or permanent patterned substrate features. In one example, a method of treating resist features comprises positioning, in a process chamber, a substrate having a set of patterned resist features on a first side of the substrate and generating a plasma in the process chamber having a plasma sheath adjacent to the first side of the substrate. The method may further comprise modifying a shape of a boundary between the plasma and the plasma sheath with a plasma sheath modifier so that a portion of the shape of the boundary is not parallel to a plane defined by a front surface of the substrate facing the plasma, wherein ions from the plasma impinge on the patterned resist features over a wide angular range during a first exposure.

In another embodiment, a method of patterning a substrate, comprises providing a first set of patterned resist features on the substrate. The method further comprises exposing the first set of patterned resist features to a first exposure of ions extracted from a plasma sheath modifier operable to provide ions incident on the substrate over a wide angular range and performing a lithographic patterning process on the substrate to form a second set of patterned resist features.

DESCRIPTION OF EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

To solve the deficiencies associated with the methods noted above, novel and inventive techniques and systems for patterning a substrate are introduced. In some embodiments, methods may involve treating temporary substrate features that are to be eventually removed, such as patterned photoresist features. In other embodiments, methods may involve treating permanent device features, such as semiconductor structures. In particular, the present disclosure focuses on techniques involving ion implantation processes for improving the quality of resist features, such as improving LWR and LER in resist features. The processes disclosed herein may be used in conjunction with processes for forming narrow features, including features that are incorporated into arrays having very small pitch, for example a pitch less than about 250 nm. Such processes include conventional DUV lithography, double patterning lithography, self aligned double patterning lithography, and other lithographic processes. However, those of ordinary skill in the art will recognize that the techniques disclosed herein are not limited to use in conjunction with any particular lithography or any range of resist feature dimensions.

Some embodiments of the invention employ plasma immersion implantation processes to treat resist features having very small dimensions. Several embodiments comprising new techniques for processing three dimensional (3D) structures are disclosed. For the purposes of clarity and simplicity, the embodiments are described as techniques for processing photoresist having surfaces oriented at multiple angles. However, those of ordinary skill in the art will recognize that the present disclosure is not limited thereto. The structure may be any type of structure having surfaces oriented at different angles.

The embodiments are also described as techniques using plasma based substrate processing systems. However, those of ordinary skill in the art will recognize that other types of sub-atomic, atomic, or molecular particle based substrate processing systems, including plasma sputtering, as well as beam line ion implantation systems, are within the scope of the present disclosure Referring to FIG. 3a, there is shown a substrate processing system 300 for processing a 3D structure according to one embodiment of the present invention. FIG. 3b illustrates angular distribution of the particles treating the photoresist. The figures are not necessarily drawn to scale.

Figure 3A:
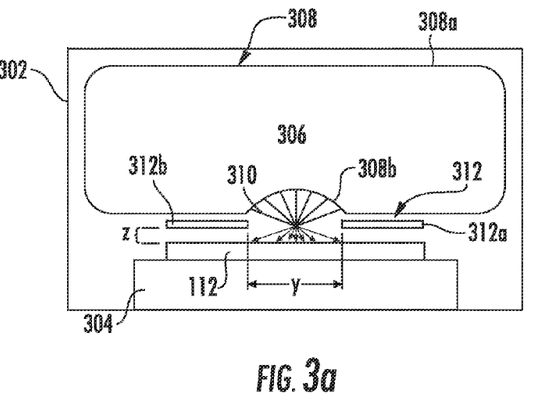
FIG. 3a is a schematic depiction of a substrate processing system, in accordance with one embodiment of the present invention.
Figure 3B:
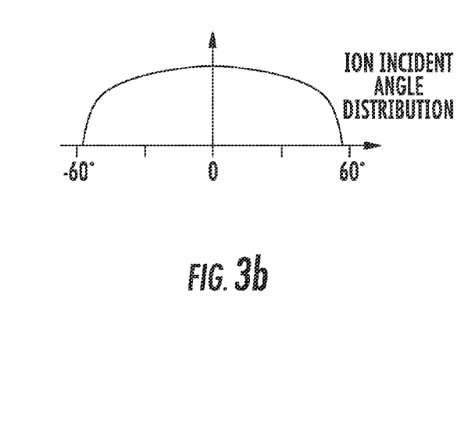
FIG. 3b illustrates an exemplary angular distribution of incident particles on a substrate, as provided by embodiments of the present invention.

As illustrated in FIG. 3a, the system 300 may include a process chamber 302 in which the substrate 112 and a platen 304 supporting the substrate 112 are disposed. In the present disclosure, the substrate 112 may be a metallic, semiconducting, or insulating material based substrate. In the present disclosure, patterned photoresist may be disposed on the substrate. The patterned photoresist may be a cured portion of the photoresist remaining on the substrate after the uncured portion is stripped.

The system 300 may also include a plasma source (not shown) for generating plasma 306 contained in the processing chamber 302. The plasma source may be an in situ or remote, inductively coupled plasma source, capacitively coupled plasma source, helicon source, microwave source, or any other type of plasma source.

Between the plasma 306 and the substrate 112, one or more plasma sheath modifiers 312 may be disposed. In the present embodiment, the plasma sheath modifier 312 may comprise a pair of modifier parts 312a and 312b spaced apart from one another by a gap "y." In another embodiment, the modifier 312 may comprise a single modifier part. Yet in other embodiments, the modifier 312 may comprise three or more modifier parts spaced apart from one another defining the gap.

The plasma sheath modifier 312 is capable of adjusting the electric field of the plasma sheath. In some embodiments, the plasma sheath modifier 312 may be positively or negatively charged. The plasma sheath modifier 312 may be made from electrically insulating (e.g. glass) or conducting (e.g. metallic) material, or a combination thereof. If the system 300 includes more than one modifier parts, the parts may be made from the same or different material. For example, the system 300 may include a plasma sheath modifier 312, and the plasma sheath modifier 312 may comprise two modifier parts 312a and 312b. The modifier parts 312a and 312b may be made from the same or different material.

If the plasma sheath modifier 312 comprises two or more parts, the parts may be disposed on the same plane or different planes. For example, the plasma sheath modifier 312 included in the processing system 300 may comprise two modifier parts 312a and 312b. The parts 312a and 312b may be disposed in the same plane such that the vertical spacings "z" between the substrate 112 and each modifier part are the same. In another embodiment, the modifier 312 may comprise two modifier parts 312a and 312b, and each part 312a and 312b may be spaced apart from the substrate 112 by different vertical spacings "z." Additional description of the processing system with the plasma sheath modifier can be found in co-pending U.S. patent application Ser. Nos. 12/418,120, filed Apr. 3, 2009 and issued as U.S. Pat. No. 8,623,171; Ser. No. 12/417,929, filed Apr. 3, 2009, and issued as U.S. Pat. No. 7,767,977; and Ser. No. 12/644,103, filed Dec. 22, 2009, and issued as U.S. Pat. No. 8,101,510, each of which is herein incorporated in its entirety by reference.

In operation, plasma generated in situ or remotely may be contained in the processing chamber 302. The plasma 306 may contain fragments including electrons, proton, and atomic or molecular ions, neutrals, and radicals of desired species. In the present disclosure, the plasma fragments 306 may be used to dope, etch, or deposit material on the substrate 112. The species contained in the plasma 306 are not limited to one or more particular species. The species may include one or more elements from Group I and 3A-8A. Example of the species contained in the may include hydrogen (H), helium (He) or other rare gases, carbon (C), oxygen (O), nitrogen (N), arsenic (As), boron (B), phosphorus (P), antimony, gallium (Ga), indium (In), carborane $C_2B_{10}H_{12}$ or other molecular compounds. As illustrated in FIG. 3, the plasma 306 may also include plasma sheath 308 near the periphery. In the present embodiment, the plasma sheath 308 may comprise positively charged ions 310.

As depicted in the Figures, sheath 308 is represented by a boundary of the sheath with plasma 306. However, it will be understood that sheath 308 may extend a finite distance from an edge of plasma 306 to surfaces of objects around plasma 306, for example, the walls of chamber 302, and the surface of substrate 112.

The ions 310 in the plasma sheath 308 or the plasma 306 may be directed toward the substrate 112, as the substrate 112 is biased by a DC or RF bias supply (not shown). The bias signal applied to the substrate 112, whether DC or RF, may be continuous or pulsed.

The plasma sheath modifier 312 may modify the shape of the plasma sheath 308 so as to control the incident angle distribution of the ions 310. For example, the plasma sheath modifier 312 may modify the electric field in the plasma sheath 242 and modify the shape of the plasma sheath 308. In the present embodiment, the plasma sheath modifier 312 may modify at least a portion of the sheath 308 into a concave shaped plasma sheath 308b (modified sheath 308b) relative to the bulk plasma 306, or a dome shaped (convex) plasma relative to the bulk plasma. When the substrate 112 is biased, the ions 310 attracted toward the substrate 112 may travel through the gap "y" between the modifier parts 312a and 312b at a large range of incident angles. In the conventional plasma based processing systems, the plasma sheath closest to the substrate lies parallel to the substrate. When the substrate is biased, the ions travel in a path substantially perpendicular to the plasma sheath, thus substantially perpendicular to the substrate. As a result, the ions in the conventional plasma processing system have incident angle ranging from $-3°$ to $+3°$. In the present embodiment, however, the incident angle of the ions 310 may be modified with the modified sheath 308b. As illustrated in FIG. 3a, the modified sheath 308b is multi-angled relative to the substrate. As such, ions 310 traveling perpendicular to the modified sheath 308b may travel in multiple angles. The ions 310 traveling toward the substrate 112 from different portions of the modified sheath 308b may have different incident angles, and the ions 310 will therefore have a large range of incident angles. As illustrated in FIG. 3b, the incident angles of the ions 310 may range between about $+60°$ to about $-60°$, centered about $0°$. In some embodiments, the incident angles of the ions 310 may additionally be modified by the electric field generated by the plasma sheath modifier 312.

Depending on a number of factors including, but not limited to, configurations and properties of the plasma sheath modifier 312, the incident angle of the ions may be additionally modified. Example of such factors may include the horizontal spacing (Y) between the modifier parts 312a and 312b, the vertical spacing (Z) between the modifier 312 and the substrate 112, difference in the vertical spacing (z) between the substrate 112 and each modifier parts 312a and 312b (not shown), and the electrical properties of the modifier 312. Other plasma process parameters may also be adjusted to adjust the ions' incident angle and/or incident angle distribution. Additional description may be found in the co-pending U.S. patent application Ser. Nos. 12/418,120, 12/417,929, 12/644,103, each of which application, as noted above, is incorporated in entirety by reference.

By modifying the plasma sheath 312, a three dimensional structure with surfaces oriented at different angles may be treated conformally or isotropically. As noted below, the modified plasma sheath 312 may be used to treat multiple surfaces of 3d structures such as, for example, 3D photoresist reliefs isotropically at the same time.

Figure 4:
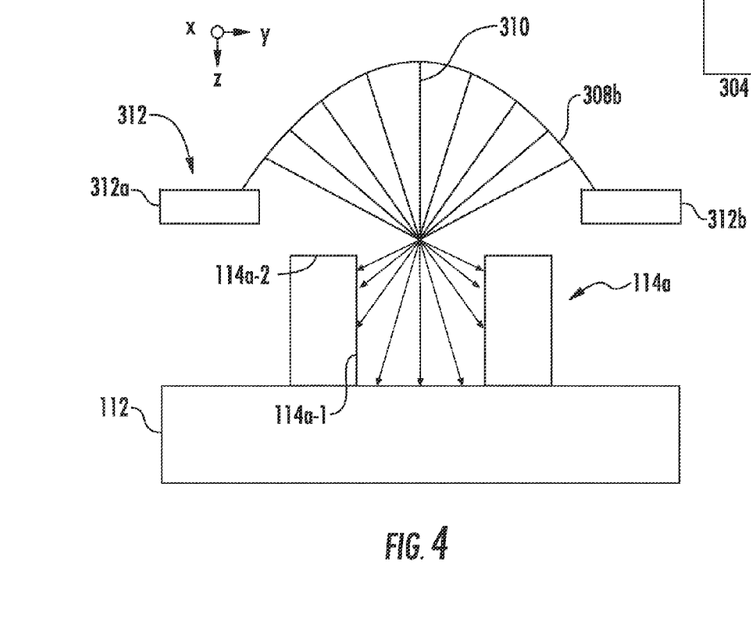
FIG. 4 depicts a schematic cross section of a plasma sheath modifier and a resist feature that illustrate exemplary features of the invention.

Referring to FIG. 4, there is shown a technique for processing 3D structure according to one embodiment of the present invention. In the present embodiment, the technique may be used to reduce LER and LWR contained in 3D photoresist relief 114a. As noted above, LER and LWR may occur in 3D photoresist relief 114a obtained during optical lithography, after uncured portion of the photoresist resist is removed. In the present embodiment, LER and LWR contained in the photoresist relief 114a may be reduced by performing plasma assisted doping (PLAD) or a plasma immersion ion implantation (PIII) process using the plasma sheath modifier 312 on different surfaces of the relief 114a. Those of ordinary skill in the art will recognize that the figure is not necessarily drawn to scale.

As illustrated in FIG. 4, 3D photoresist relief 114a having side surface 114a-1 and top surface 114a-2 may be disposed on the substrate 112. The substrate 112 and the photoresist relief 114a disposed in the plasma processing system containing the plasma sheath modifier 312, and plasma is disposed near the substrate 112. Thereafter, the ions 310 in the plasma may be directed through the gap between the plasma sheath modifier parts 312a and 312b, toward the surfaces of the photoresist relief 114a. As illustrated in the figure, the ions 310 may be directed at multiple incident angles.

In the present embodiment, the ions 310 may be implanted into the side and top surfaces 114a-1 and 114a-2 of the photoresist relief 114a. Although various ion species may be implanted, helium (He) or argon (Ar) ions may be implanted in the present invention. Although the duration of exposure of the resist to ions may cover a wide range, in embodiments of the present invention, the exposure time may vary from about one second to several minutes.

Experiments were conducted to study the effect on LER of a plasma processing system (PSM system) arranged in accordance with the present invention. As used hereinafter, the term "PSM system" or "PSM plasma system" refers to a plasma processing system that employs a plasma sheath modifier to provide a wide range of angular distribution of ions toward a substrate positioned adjacent to a portion of the plasma. The term "wide," "wide range," or "wide angular range," as used in conjunction with angle of ion incidence, refers to a set of angles that spans a total range of about 5 degrees or larger. A plasma sheath modifier was used to provide an exposure comprising a dose of ions distributed over a wide angular range, as illustrated in FIG. 3b. In some instances, the term "extraction plate" may be used to refer to a plasma sheath modifier, which may comprise a plate having an aperture that induces formation of a modified plasma sheath (see element 308b) and also extracts ions from the plasma such that the ions impinge on a substrate over a wide angular range.

Referring again to FIG. 4, a set of resist lines having nominal CD of about 40 nm was exposed to a 3 kV He plasma using an exemplary extraction plate. By implanting He ions 310 into both the top 114-2 and side 114a-1 surfaces of the photoresist relief 114a at 3-4 kV, the LER improved from 5.6 to 3.2 nm, and an improvement of about 40% in LER and LWR was observed. By implanting He ions using the plasma sheath modifier 312, the improvements occurred isotropically, on the multiple surfaces 114a-1 and 114a-2 of the photoresist relief 114a, at the same time.

In addition, only minimal critical dimension shrinkage of the photoresist relief 114a was observed. In particular, the measured CD before processing of 39.1 nm was only reduced to 37.6 nm after processing, representing only a 4% shrinkage when the resist relief 114a was implanted with He ions 310 at multiple incident angles. Minimal faceting or sputtering was also observed. As PLAD or PIII process is a low energy process, the depth by which the ions 310 are implanted is very low. As such, any change to the photoresist relief 114a caused by ion implantation such as, for example, resist shrinkage and/or sputtering may be minimal.

In various embodiments, an optimum line roughness for patterned resist features may depend upon the nature of the devices to be fabricated in an underlying substrate using the patterned resist. Accordingly, in embodiments of the present invention, a set of parameters may be tuned to produce an optimum reduction in desired roughness features. These parameters may include, among others, ion type, ion energy, resist type, resist feature size, as well as geometrical features associated with the plasma sheath modifier. With reference again to FIG. 3a, the latter features include the horizontal spacing Y, vertical spacing Z, and other factors, which are disclosed in more detail in the co-pending U.S. patent application Ser. Nos. 12/418,120, 12/417,929, and 12/644,103.

The aforementioned exemplary systems, methods, and compositions may, in general, be used in any combination to provide improved roughness results, such as reductions in LWR/LER, reductions in high, low, and medium frequency roughness variations, and similar patterned resist attributes.

In addition to reducing linewidth roughness, concurrent, isotropic hardening of multiple surfaces of photoresist features may be induced according to some embodiments. Referring again to FIG. 4, after exposure to wide angular range of ion flux, isotropic hardening has been observed in patterned resist features generally depicted as photoresist relief 114a. Concurrent, isotropic hardening of the photoresist relief 114a may be advantageous if an additional optical lithographic process is performed to achieve double patterning lithographic (DPL) or self-aligned double patterning lithographic (SADPL) process. In DPL or SADPL, a second lithographic process is performed to generate additional photoresist reliefs between two original photoresist reliefs formed during the first lithographic process. Forming additional photoresist reliefs may decrease the distance therebetween and may lead to a substrate 112 with trenches with even smaller widths. During the second lithographic process, a chemical treatment may be performed. When performed, the structure of the photoresist relief formed during the first lithographic process may be adversely affected. In the present embodiment, isotropically hardened photoresist relief 114a may be able to withstand the chemical treatment associated with the second lithographic process. As such, an additional lithographic process to achieve DPL or SADPL may be possible.

Figures 5A, 5B, 5C, 5D:
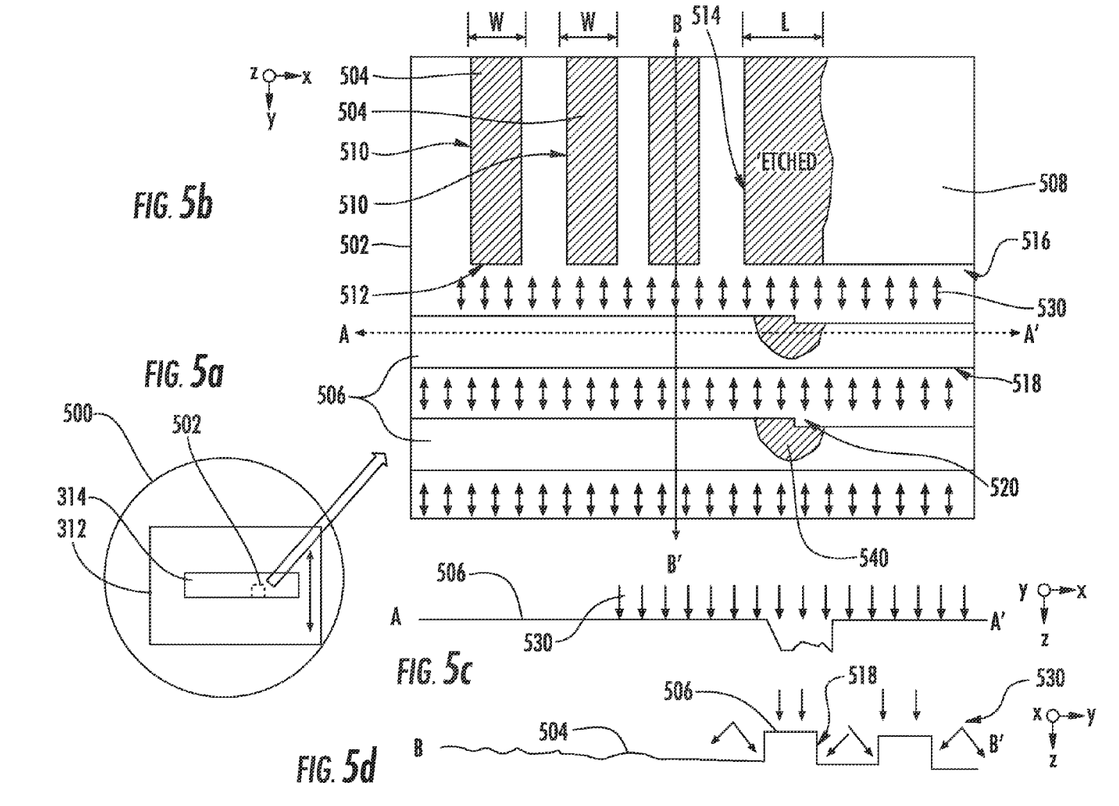
FIGS. 5a-5d depict exemplary results of an embodiment of processing a 3D resist pattern.

FIGS. 5a-5d depict exemplary results of an embodiment of processing a 3D resist pattern. In this example, several different types of resist features were subjected to an ion exposure using an exemplary extraction plate (plasma sheath modifier) to provide a wide angular range of ions in order to clarify the operation of exemplary resist hardening processes. Referring to FIG. 5a, a substrate 500 includes a portion 502 that is subjected to an exemplary exposure to a wide angular distribution of ions using an exemplary plasma sheath modifier, such as plate 312. In the example of FIG. 5*a*, a plate 312 having an aperture 314 may be disposed over substrate 500 such that ions impinge on substrate 500 through aperture 314, which may be scanned with respect to substrate 500 along the y-direction. Referring also to FIG. 4, the view of plate 312 shown in FIG. 4 is along the y-direction illustrated in FIG. 5*d*. FIG. 5*b* depicts a closer view of portion 502, which includes patterned vertical resist lines 504 (long axes parallel to the y-direction), horizontally arranged lines 506 (long axes parallel to the x-direction), and blanket portion 508. The substrate portion 502 is depicted after exposure of the resist features to an exemplary wide angular ion flux 530, followed by exposure to a liquid etchant used for the purposes of mimicking a resist development process. Ion flux 530 is shown in the figures, although the structure of resist features shown in the figures corresponds to their resulting structure after ion bombardment is terminated followed by subsequent exposure to liquid etchant.

As illustrated in the figures, in this example, the ions 530 impinge upon the substrate portion 502 generally parallel to the y-direction (as defined in FIG. 4 and FIG. 5) and over a range of incidence angles, as illustrated further in FIG. 5*d*. In FIG. 5*d*, each resist line 506 is impacted by ions 530 on the top portion of the resist line and along sidewalls 518. The results of etching the various resist features are shown in a top plan view in FIG. 5*b* and in cross-section along the lines A-A' and B-B' in FIGS. 5*c* and 5*d*, respectively. As evident, a preferential etching of portions of the resist features occurs, which illustrates the effect of the exemplary wide angular ion bombardment on the etch resistance of patterned resist features.

In particular, those portions of the resist features that are not subject to ion bombardment are highly susceptible to etching. For example, blanket region 508 has a horizontal edge 516, which is exposed to ions 530 and a vertical edge 514, which is disposed parallel to ions 530 and therefore does not receive direct ion bombardment from ions 530. As shown in FIG. 5*b*, substantial resist etching occurs over a length L that extends inwardly from unprotected (that is, unbombarded) vertical edge 514. Similarly, vertical lines 504, which each have a pair of unprotected vertical edges 510, are substantially etched across their individual widths W, which distance is less than etch length L. Accordingly, the entire width of the lines 504 is substantially attacked by etching. On the other hand, horizontal lines 506, which are subject to ion bombardment along their entire sidewalls 518, are substantially protected from etching, save for regions 540 immediately adjacent to small vertical notches 520, which do not receive ion bombardment.

Accordingly, embodiments of the present invention may employ an exemplary plasma sheath modifier to subject patterned resist lines to a wide angular ion flux in order to harden the patterned resist features to subsequent processing. Such subsequent processing may include, for example, etchants that readily attack unhardened resist. In some embodiments, the patterned resist features may be arranged such that their sidewalls and tops are oriented to receive wide angular ion bombardment from an exemplary extraction plate.

In one embodiment of a double patterning lithography process, in a first step, a first set of patterned resist features (reliefs) is formed using a first lithographic process sequence. In a subsequent step, the first set of patterned resist features are subjected to a first exposure that comprises wide angular ion bombardment. The resist features may be arranged so as to expose both sidewalls and tops of the resist features to ion flux. In this manner, some or all resist surfaces that may be exposed to subsequent etchants may be hardened to resist the etchant attack. The wide angular ion bombardment may be carried out using a plasma sheath modifier arranged to simultaneously expose the sidewalls and tops of the resist features to ions. In a further step, a second lithographic process sequence is performed so as to define a second set of patterned resist features. In various embodiments, the first exposure hardens the first set of resist features in a manner that reduces or prevents the resist features from being degraded, such as being etched by chemical treatment or melted during the second lithographic processing sequence.

In various other embodiments, additional substrate relief features, such as permanent features that remain in the substrate after final processing, may be exposed to wide angular ion flux. In some embodiments, semiconductor substrate features may be ion implanted in a wide angular ion flux exposure using an extraction plate having a plasma sheath modifier. The semiconductor substrate features may be small semiconductor relief features, such as silicon-based materials including Si, SiGe alloys, or similar materials. This may be useful in the formation of devices that employ single crystal semiconductor features, such as in known FINFET double gate devices. For example, in some process sequences, a silicon structure, such as a channel region of a FINFET, may be subjected to an ion implantation process. In conventional ion implantation procedures, the external shape of such silicon fins may be substantially altered by ion implantation, which may adversely affect device performance by the eventual transistors formed using the FINFET process.

Figure 6:
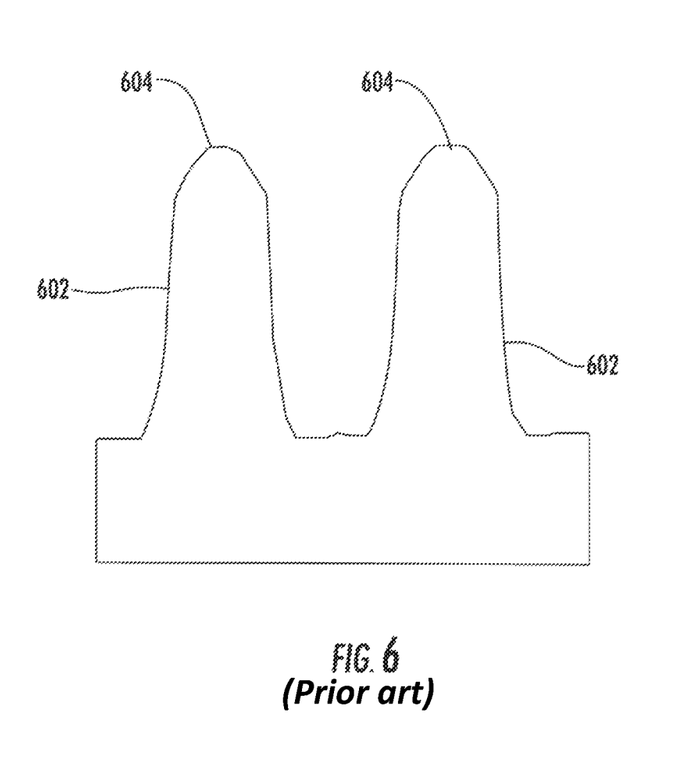
FIG. 6 depicts patterned silicon features after exposure to known ion implantation.

FIG. 6 depicts a profile of silicon relief features 602 after exposure to a conventional 1.4 kV Ar ion implantation process. In this example, the width of such features is on the order of 100 nm. As shown, the top portions 604 exhibit strong faceting and the sidewalls are generally sloped. In addition, the top of such features may be partially etched, reducing the overall height of such features.

Figure 7:
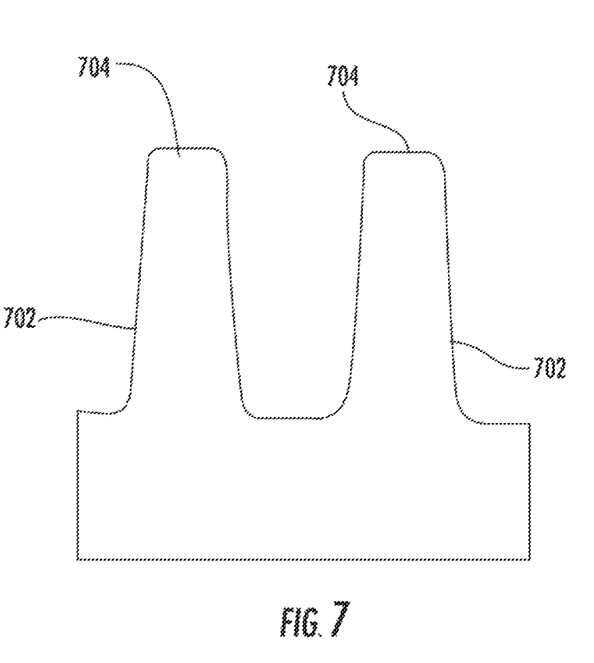
FIG. 7 depicts patterned silicon features after exposure to an exemplary wide angular range of ion flux.

In contrast, similar silicon relief features 702, which are exposed to an exemplary wide angular Ar ion implantation process at 4 kV, show minimal faceting in top regions 704 and exhibit generally straight sidewalls, as depicted in FIG. 7. Thus, the exemplary wide angular ion implantation may result in a more ideal structure for a device fabricated from silicon relief features 702. This, in turn may facilitate better device performance.

Figures 8A, 8B:
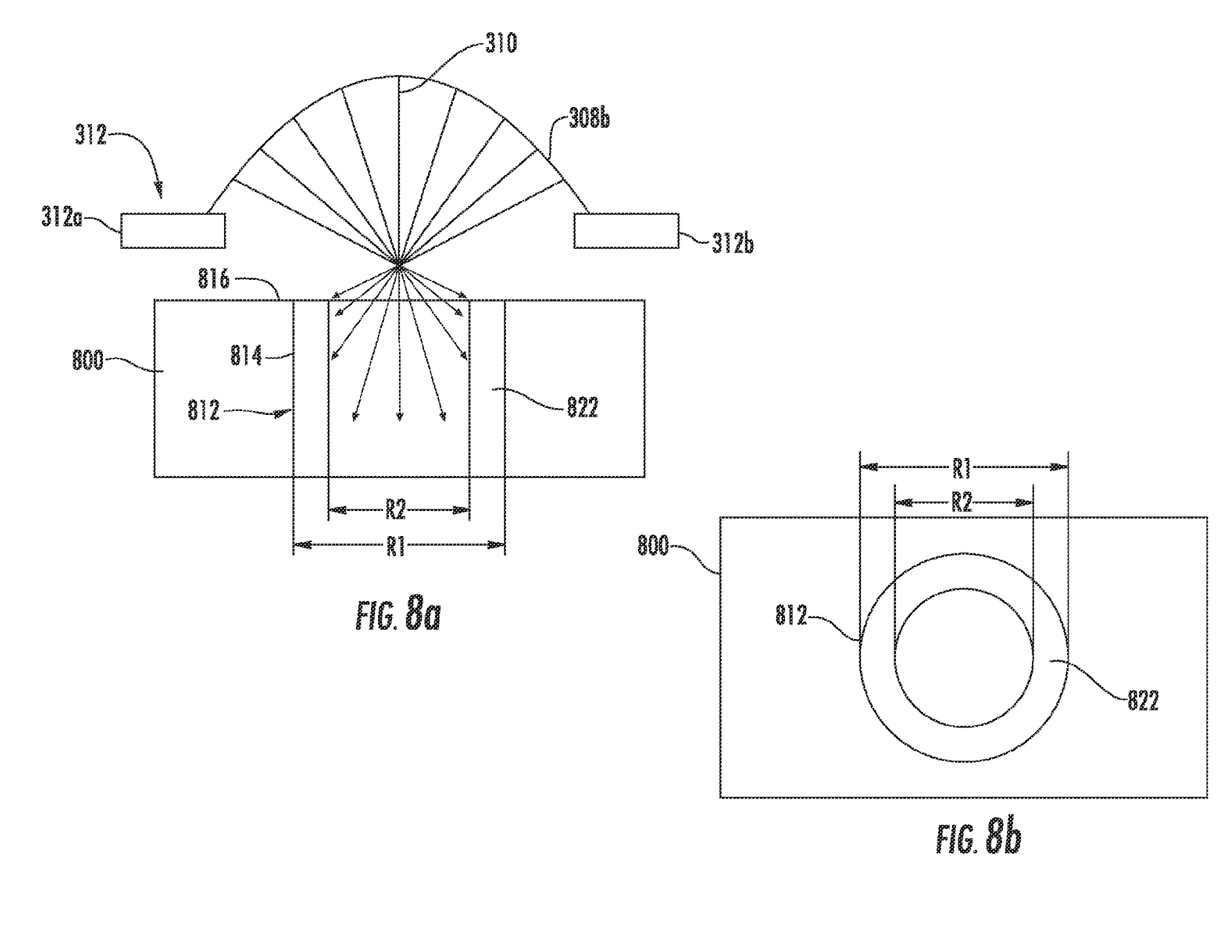
FIGS. 8a and 8b depicts an embodiment of 3D processing.

Although the aforementioned embodiments of the invention are generally directed to systems and processes that employ ion bombardment for reducing roughness in surface features, as well as reducing the loss in critical dimension that may occur with such smoothening processes, other embodiments provide mechanisms that employ ion bombardment for adding material to surface patterned features. Referring to FIGS. 8*a* and 8*b*, there are shown a simplified illustration of a technique for processing a 3D structure, according to another embodiment of the present disclosure. In this embodiment, a technique for decreasing the area of a hole is shown. In this embodiment, the substrate 800 may be a metallic substrate, a semiconducting substrate, or dielectric substrate. The substrate 800 may comprise a hole 812. Although the present embodiment may be described in context to processing a substrate having a hole with first radius $R_1$, the present disclosure is not limited thereto. Similar to the photoresist of the earlier embodiment, the substrate 800 in the present embodiment may simply be a structure having one or more vertically extending surfaces.

In the present embodiment, ions 310 are directed toward the sidewall surface 814 of the hole 812 at multiple incident angles. As depicted, the sidewall 814 forms and angle with respect to the top surface 816 of substrate 800, which may be about 90 degrees in some embodiments. Although ions are preferred, the present invention does not preclude other particles including radicals or other neutrals. The ions 310 directed toward the surface of the hole 812 may then be deposited onto the surface of the hole 812 thereby forming a boundary layer 822 having a second radius $R_2$. By using the plasma sheath modifier 312, the ions 310 may be directed toward the surface of the hole 812 at multiple incident angles. As a result, a conformal, isotropic deposition may occur, and the boundary layer 822 with uniform thickness may form. Further, a radius of the original hole in the substrate 800 may decrease from $R_1$ to $R_2$, conformally and uniformly.

The methods described herein, may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art includes such devices as a readable or writeable CD, flash memory chips (e.g., thumb drives), various magnetic storage media, and the like.

In summary, the present invention provides novel and inventive methods and systems for treating patterned features, such as photoresists or permanent substrate relief structures. The present invention can be deployed in systems that employ relatively low ion energy, such as plasma immersion systems, which affords the ability to provide ions and other species that have only a small penetration depth into the patterned features. This facilitates the ability to provide surface smoothening without substantially impacting resist pattern attributes, such as profile, and CD. By providing a substantial flux of ions at angles far from the normal, the PSM architecture of the present invention is especially effective in attacking resist features in areas most directly affected by surface roughness, that is, the resist sidewalls. Embodiments of the present invention, such as those employing inert gas plasmas, are not susceptible to pattern dependent effects that are prevalent using dry chemical processes, such as RIE. Furthermore, by employing a plasma sheath modulator in conjunction with plasma process systems, such as immersion implantation systems, the present invention offers a large flexibility for tailoring resist treatment processes. This is due to the variety of plasma parameters that can be conveniently and independently tuned, such as gas composition, ion energy, ion dose, and range of angles of incidence of ions.

The present invention is not to be limited in scope by the specific embodiments described herein. Indeed, other various embodiments of and modifications to the present disclosure, in addition to those described herein, will be apparent to those of ordinary skill in the art from the foregoing description and accompanying drawings. Although the present invention may be deployed in plasma immersion ion implantation systems using low energy ions, ion bombardment effects other than, or in addition to ion implantation, may contribute to resist smoothening, and the present invention may be deployed in other plasma systems capable of providing low energy ions.

Moreover, in addition to implanting or depositing, the techniques disclosed in the present disclosure may be used to perform etching on the photoresist structure or a structure other than the photoresist structure. For example, the techniques disclosed in the present disclosure may be used to perform photoresist trim process to reduce the critical dimension of the gate on a transistor. Contrary to the conventional trim process where the trim process is performed one surface at a time using by $O_2$+HBr plasma, the technique of the present disclosure may be used to direct etching agents (e.g. ions) at multiple angles and perform the trim process isotropically on multiple surfaces at the same time. As such, the trim process may be performed much efficiently and more uniformly. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. A method of treating a hole in a substrate, comprising:
generating a plasma in a process chamber having a plasma sheath adjacent to a first surface of a substrate facing the plasma sheath, wherein the substrate comprises a hole sidewall surface that forms an angle with respect to the first surface; and
selectively varying an electric field in the plasma sheath with a plasma sheath modifier oriented parallel to the first surface of the substrate to modify a shape of a portion of the plasma sheath defined between the plasma and the first surface, wherein the modified shape is not parallel to the first surface of the substrate and wherein ions from the plasma impinge on the hole sidewall surface over an angular range.

2. The method of claim 1, wherein the ions comprise species arranged to condense upon the surface of the hole.

3. The method of claim 1, wherein the modifying operation comprises creating a gap within a plate, the plate comprising one of an insulator, metal, and semiconductor; and
wherein the modified shape is a convex or concave shape relative to a plane defined by the first surface of the substrate.

4. The method of claim 1, wherein the hole sidewall surface forms an angle of about 90 degrees with respect to the first surface.

5. The method of claim 1, wherein the substrate is a semiconductor substrate.

6. The method of claim 1, wherein the hole has a first radius, and the ions impinging on the hole sidewall surface deposit onto the hole sidewall surface to form a boundary layer having a second radius that is smaller than the first radius.

7. The method of claim 5, wherein the ions impinging on the hole sidewall surface cause a conformal isotropic deposition that forms a boundary layer having a uniform thickness.

8. A method of treating a hole in a substrate, comprising:
generating a plasma in a process chamber having a plasma sheath adjacent to a first surface of a substrate facing the plasma sheath, wherein the substrate comprises a hole with a vertically extending surface; and
selectively varying an electric field in the plasma sheath with a plasma sheath modifier oriented parallel to the first surface of the substrate to modify a shape of a portion of the plasma sheath defined between the plasma and the first surface, wherein the modified shape is not parallel to the first surface of the substrate, and wherein ions from the plasma impinge on the vertically extending surface of the hole over an angular range.

9. The method of claim 8, wherein the plasma includes radicals or other neutrals.

10. The method of claim 8, wherein the modifying operation comprises creating a gap within a plate, the plate comprising an insulator, a metal, or a semiconductor; and
   wherein the modified shape is a convex or a concave shape relative to the first surface of the substrate.

11. The method of claim 8, wherein the vertically extending surface has a first radius.

12. The method of claim 11, wherein the ions impinging on the vertically extending surface deposit onto the vertically extending surface to form a boundary layer.

13. The method of claim 12, wherein the boundary layer has a second radius smaller than the first radius.

14. The method of claim 8, wherein the substrate comprises a semiconductor material.

15. The method of claim 8, wherein the ions impinging on the vertically extending surface result in a conformal isotropic deposition to form a boundary layer have a uniform thickness.

16. A method of treating a hole in a substrate, comprising:
   generating a plasma in a process chamber having a plasma sheath adjacent to a first surface of a substrate facing the plasma sheath, the substrate including a hole with a sidewall surface; and
   selectively varying an electric field in the plasma sheath with a plasma sheath modifier oriented parallel to the first surface of the substrate to modify a shape of a portion of the plasma sheath between the plasma and the plasma sheath with a first surface, wherein at least a portion of the modified shape is concave or convex, and wherein ions from the plasma impinge on the sidewall surface over an angular range.

17. The method of claim 16, wherein the modifying operation comprises creating a gap within a plate, the plate comprising at least one of an insulator, a metal, and a semiconductor.

18. The method of claim 16, wherein the sidewall surface has a first radius, and the ions impinging on the sidewall surface deposit onto the sidewall surface to form a boundary layer having a second radius smaller than the first radius.

19. The method of claim 16, wherein the substrate comprises a semiconductor material.

20. The method of claim 16, wherein the sidewall surface forms an angle of about 90 degrees with respect to the first surface.

* * * * *